United States Patent
Kim et al.

(10) Patent No.: US 7,564,680 B2
(45) Date of Patent: Jul. 21, 2009

(54) DISPLAY APPARATUS AND METHOD OF COMBINING CHASSIS BASE WITH BOSS

(75) Inventors: Myoung-Kon Kim, Suwon-si (KR); Won-Kyu Bang, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/775,775

(22) Filed: Jul. 10, 2007

(65) Prior Publication Data

US 2008/0007903 A1    Jan. 10, 2008

(30) Foreign Application Priority Data

Jul. 10, 2006 (KR) .................. 10-2006-0064455

(51) Int. Cl.
*H05K 7/12* (2006.01)
(52) U.S. Cl. .................. 361/679.21; 349/58
(58) Field of Classification Search .......... 361/681; 349/58
See application file for complete search history.

(56) References Cited

U.S. PATENT DOCUMENTS

| | | | | |
|---|---|---|---|---|
| 5,148,350 A | * | 9/1992 | Chan et al. | 361/721 |
| 5,532,889 A | * | 7/1996 | Stefansky et al. | 360/97.01 |
| 5,719,752 A | * | 2/1998 | Mori et al. | 361/807 |
| 7,057,884 B2 | * | 6/2006 | Davidson et al. | 361/679 |
| 2003/0030997 A1 | * | 2/2003 | Mizusaki | 361/758 |
| 2006/0044745 A1 | * | 3/2006 | Kim | 361/681 |
| 2006/0192730 A1 | * | 8/2006 | Kim et al. | 345/60 |

FOREIGN PATENT DOCUMENTS

| | | |
|---|---|---|
| KR | 10-2000-0055482 A | 9/2000 |
| KR | 10-2006-0022468 A | 3/2006 |
| KR | 10-0627320 | 8/2006 |

OTHER PUBLICATIONS

KIPO Office action dated Feb. 24, 2009, for priority Korean application 10-2006-0064455, noting listed reference in this IDS.

* cited by examiner

*Primary Examiner*—Jayprakash N Gandhi
*Assistant Examiner*—Ingrid Wright
(74) *Attorney, Agent, or Firm*—Christie, Parker & Hale, LLP.

(57) ABSTRACT

A display apparatus includes a display panel for displaying an image, a chassis base for supporting the display panel, at least one boss protruding from the chassis base for supporting a plurality of circuit boards for driving the display panel, and at least one embossment protruding from the chassis base in a region around the at least one boss.

12 Claims, 5 Drawing Sheets

DISPLAY APPARATUS AND METHOD OF COMBINING CHASSIS BASE WITH BOSS

CROSS-REFERENCE TO RELATED PATENT APPLICATION

This application claims priority to and the benefit of Korean Patent Application No. 10-2006-0064455, filed on Jul. 10, 2006, in the Korean Intellectual Property Office, the entire disclosure of which is incorporated herein by reference.

BACKGROUND OF THE INVENTION

1. Field of the Invention

The present invention relates to a display apparatus, and more particularly, to a chassis base for a display apparatus.

2. Description of the Related Art

Recently, flat panel display apparatus such as liquid crystal displays, plasma display panels, field emission displays, and vacuum fluorescent displays have been developed.

A plasma display panel is a flat panel display device that displays an image using a gas discharge. Plasma display panels have become popular since they can be manufactured to be large and thin, with a wide viewing angle, and can display high quality images. A conventional plasma display apparatus includes a plasma display panel combining a front panel and a rear panel.

SUMMARY OF THE INVENTION

A display apparatus is provided including a display panel for displaying an image, a chassis base for supporting a plurality of circuit boards for driving the display panel, an embossment protruding from the chassis base in a region around at least one boss, the at least one boss protruding from the embossment. In one exemplary embodiment, the at least one boss is press fitted to the embossment and a periphery of each embossment includes at least one arc section. The embossment may have an elongated shape in the region around the at least one boss.

A method of combining a chassis base and a boss is provided including forming an embossment protruding from a region of the chassis base, forming a hole in the embossment, disposing a die on a surface of the embossment of the chassis base in a direction opposite to which the embossment protrudes, providing a boss having a shaft portion and a press-fittable base portion at an end of the shaft portion, inserting the shaft portion into the hole, and press fitting the base portion with the hole using a punch.

BRIEF DESCRIPTION OF THE DRAWINGS

FIG. 4b is a cross sectional view of the press fitting of claim 4a.

DETAILED DESCRIPTION

Figure 1:
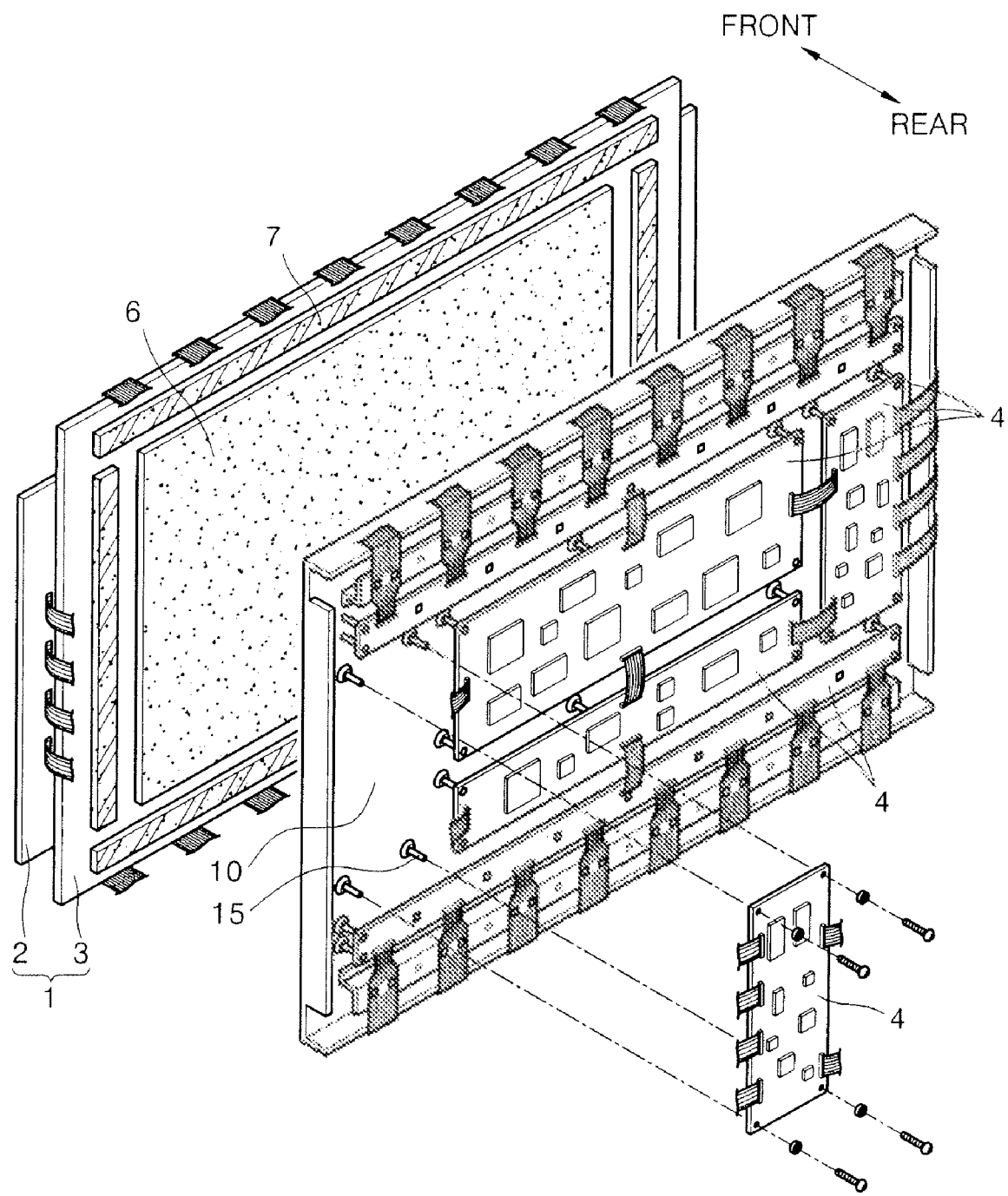
FIG. 1 is an exploded perspective view of circuit boards mounted to a plasma display device according to an exemplary embodiment of the present invention.

Referring now to FIG. 1, a plasma display device includes a plasma display panel 1 mounted to a chassis base 10 by a fixing means 7 with a thermal conductive medium 6 located on one surface of the rear panel. The plasma display panel 1 includes a front panel 2 and a rear panel 3. Circuit boards 4 may be mounted to the chassis base 10 using bosses 15, as described in more detail below.

FIGS. 2-5 show several exemplary embodiments of the present invention including bosses 15, 25, 35, 45 press-fitted to a respective chassis base 10, 20, 30, 40, 50.

A plasma display device includes a plasma display panel including a front panel and a rear panel. When the plasma display panel is a three-electrode type surface discharge AC PDP, the front panel includes a transparent front substrate, sustain electrode pairs formed on the front substrate to generate a sustain discharge, a front dielectric layer covering the sustain electrode pairs, and a protective layer coated on the front dielectric layer. The rear panel includes a rear substrate, address electrodes crossing the sustain electrode pairs, a rear dielectric layer covering the address electrodes, barrier ribs that form discharge cells by defining a discharge space, and phosphor layers coated on the discharge cells.

After the front and rear panels are combined with each other, a discharge gas is injected into the discharge cells. A voltage is then applied to the sustain electrode pairs and the address electrodes, generating a gas discharge in the discharge cells. When the gas discharge is generated, ultraviolet rays are emitted, exciting the phosphor layers to emit visible light. Thus, an image is displayed using the visible light emitted from the discharge cells. The plasma display panel according to exemplary embodiments of the present invention may be of various types including a three-electrode type surface discharge AC PDP.

A thermal spread sheet (not shown) may be attached to a rear surface of the plasma display panel to dissipate heat generated during the operation of the plasma display panel. The chassis base 10 may be disposed on the rear of the plasma display panel, and may be combined with the plasma display panel using an adhesive element, such as a double-sided tape. A plurality of circuit boards that generate electrical signals for applying a voltage to the sustain electrode pairs and the address electrodes of the plasma display panel are mounted on the rear of the chassis base 10. In order to apply a voltage to each of the sustain electrode pairs and the address electrodes of the plasma display panel, terminal units of each of the sustain electrode pairs and the address electrodes of the plasma display panel are electrically connected to terminals of the circuit boards by signal transmitting elements.

The chassis base 10 according to one exemplary embodiment is formed from a steel group material such as an aluminum-zinc alloy coated steel sheet or EGI (electrolytic galvanized iron) to a thickness of about 1.0 mm or less, for example, about 0.8 mm, and thus, the chassis base 10 is lightweight. A plasma display panel is supported by the front of the chassis base 10 and the circuit boards are supported by the rear of the chassis base 10. Accordingly, the chassis base 10 is required to have a high strength and therefore, a reinforcing member may be attached to the rear of the chassis base 10.

The circuit boards may be combined with the chassis base 1 using a screw combining method in which bosses 15 and screws are used. More specifically, the bosses 15 are coupled to the chassis base 10, screw threads being formed on internal surfaces of the bosses 15. The circuit boards can be combined with the chassis base 10 when the screws are screwed into the threads of the bosses 15 through holes in the circuit boards.

When the bosses 15 are press fitted to the conventional thin steel chassis base 10, the chassis base 10 may deform, reducing an overall strength of the chassis base 10. As depicted in FIGS. 2 through 5, embossments 10a, 20a, 30a, 30b, and 40a are formed around bosses 15, 25, 35, and 45 of chassis bases 10, 20, 30, and 40, respectively, to prevent the chassis bases from deforming.

Figure 2:
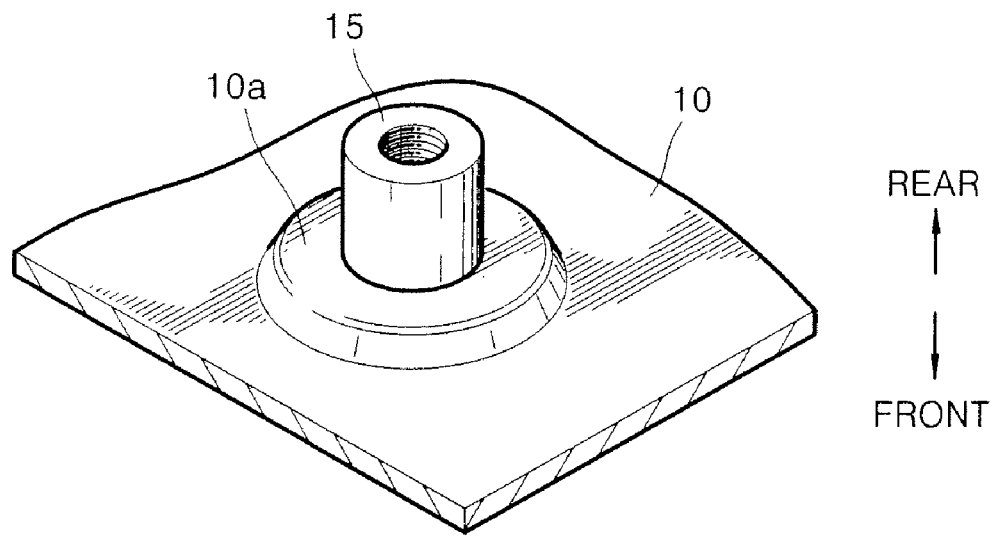
FIG. 2 is a perspective view illustrating a press fitting of a boss to a chassis base of a plasma display apparatus according to an exemplary embodiment of the present invention.
Figure 3:
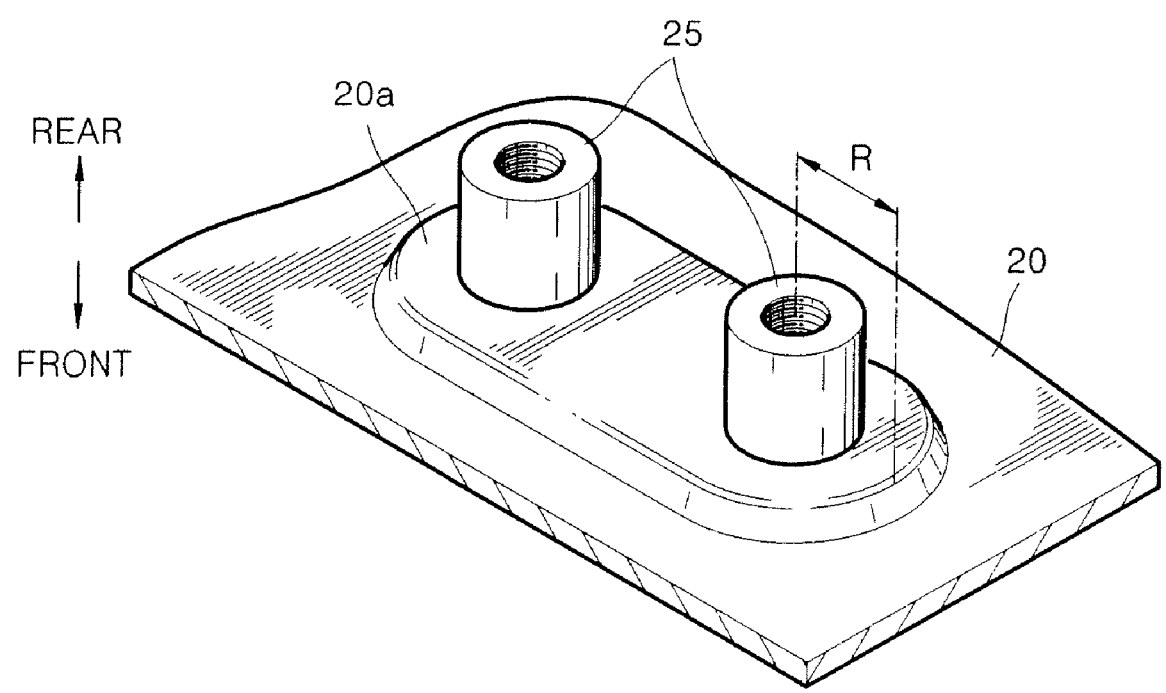
FIG. 3 is a perspective view illustrating a press fitting of two bosses to a chassis base of a plasma display apparatus according to another exemplary embodiment of the present invention.

Referring to FIG. 2, the embossment 10a protrudes from a surface of the chassis base 10 in a region around the boss 15 in the same direction in which the boss 15 protrudes. The embossment 10a may have a generally circular shape. Referring to FIG. 3, the embossment 20a protrudes from a surface of the chassis base 20 in a region around the two bosses 25 in the same direction in which the two bosses 25 protrude. The embossment 20a may be formed so that both ends are curved into arcs having radii less than or equal to R from the centerlines of the two bosses 25, where R is a distance about 40 mm or less.

Figure 4A:
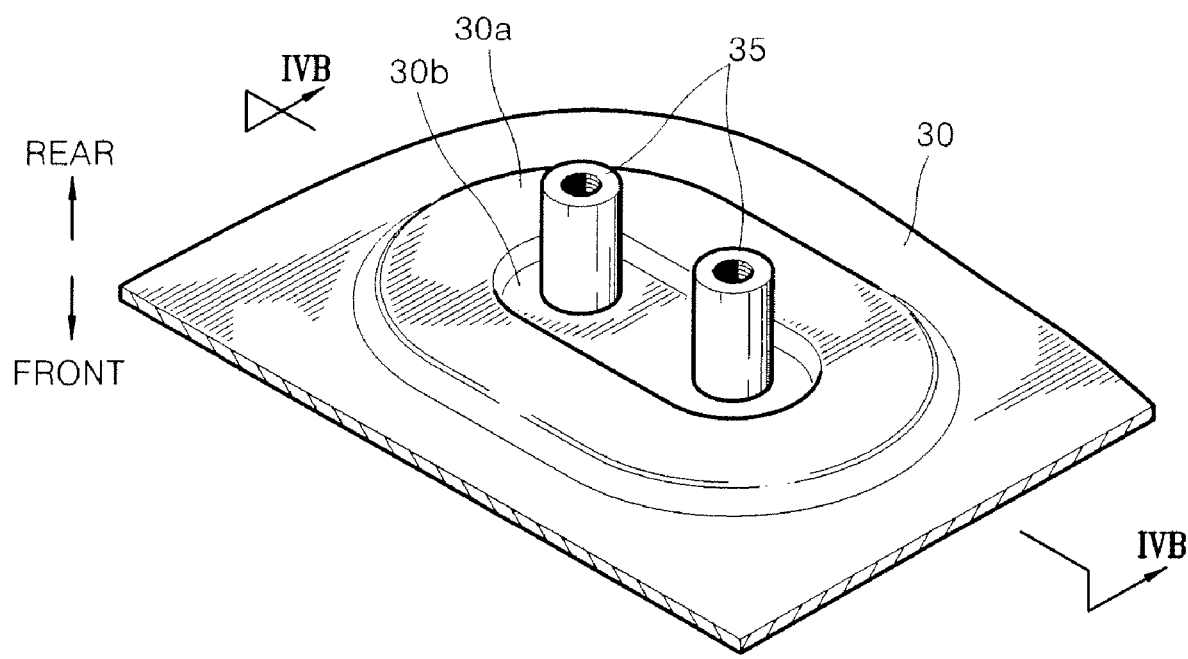
FIG. 4a is a perspective view illustrating a modified version of a press fitting of two bosses to a chassis base of a plasma display apparatus according to yet another embodiment of the present invention.
Figure 4B:
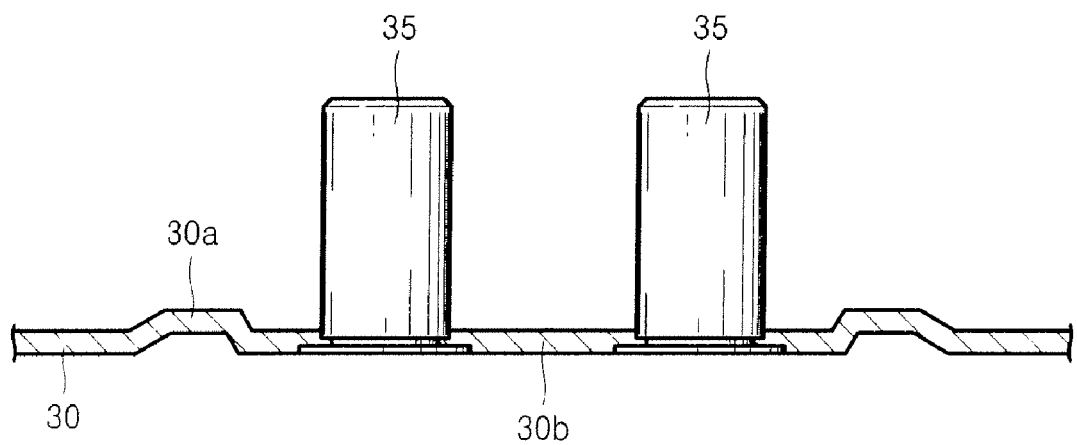

Referring to FIGS. 4a and 4b, an embossment of the two bosses 35 includes a first embossment 30a and a second embossment 30b. More specifically, the first embossment 30a protrudes from a surface of the chassis base 30 in a region around the two bosses 35 in the same direction in which the two bosses 35 protrude, and the second embossment 30b is recessed from a surface of the first embossment 30a in a direction opposite to which the bosses 35 protrude. A radius of arc ends of the second embossment 30b may be less than a radius of arc ends of the first embossment 30a. Accordingly, an increase in the height of the bosses 35 due to the embossing processing may be prevented.

Figure 5:
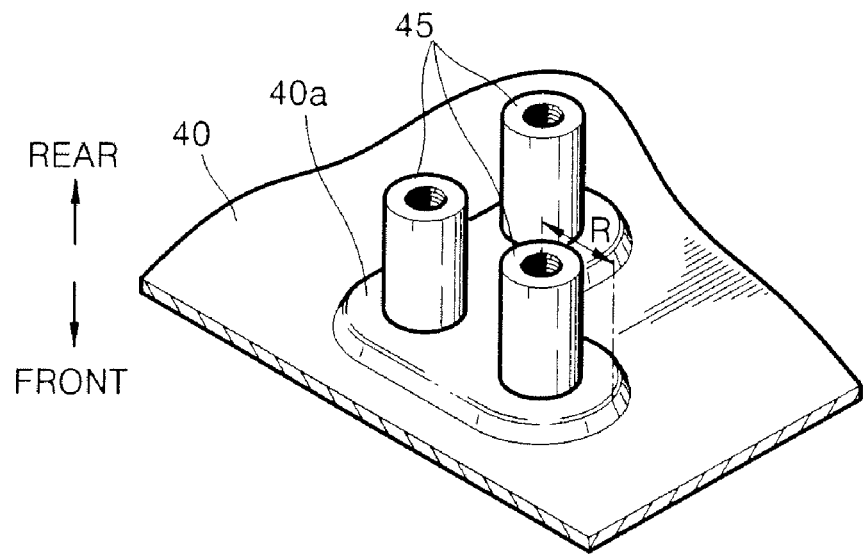
FIG. 5 is a perspective view illustrating a press fitting of three bosses to a chassis base of a plasma display apparatus according to still another embodiment of the present invention.

Referring to FIG. 5, an embossment 40a protrudes from a surface of the chassis base 40 in the same direction in which the three bosses 45 protrude. The embossment 40a may have a shape in which three circular arcs are formed in regions around the three bosses 45 and have radii less than or equal to R from the centerlines of the three bosses 45, where R is a distance of about 40 mm or less. Accordingly, when the three bosses 45 are disposed in an "L" shape, the embossment 40a also has a corresponding "L" shape.

Figure 6:
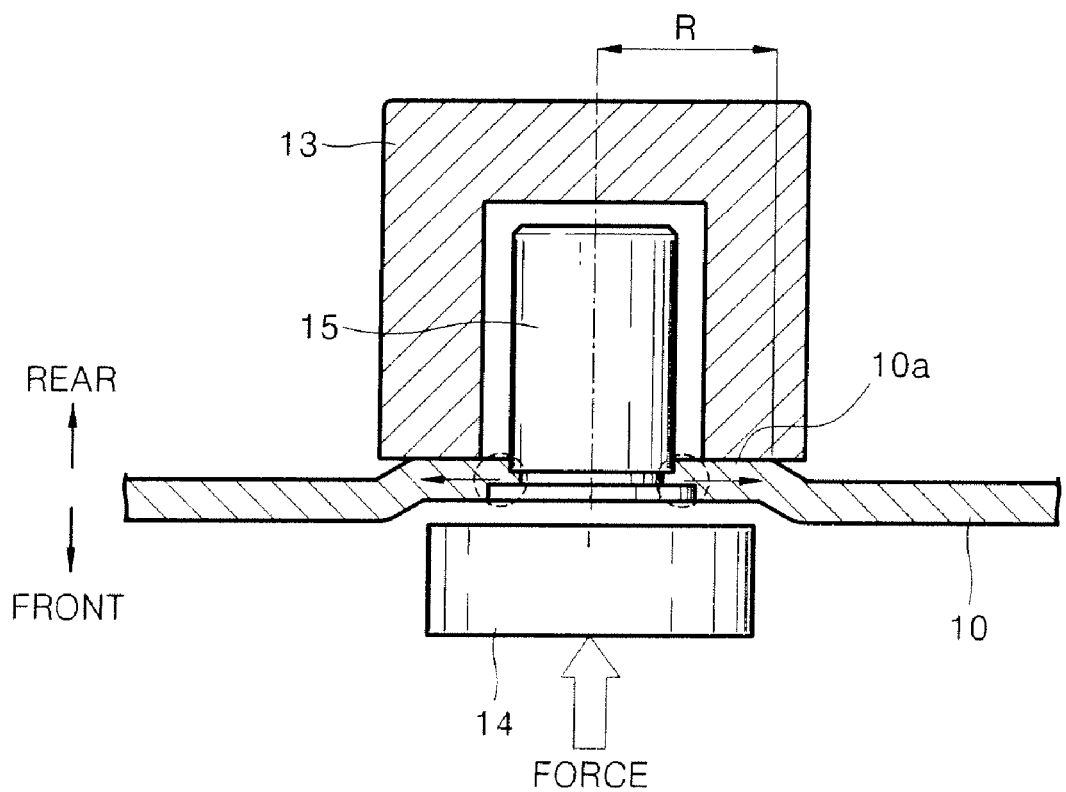
FIG. 6 is a cross-sectional view illustrating a press fitting of a boss to a chassis base according to yet another embodiment of the present invention.
Figure 7:
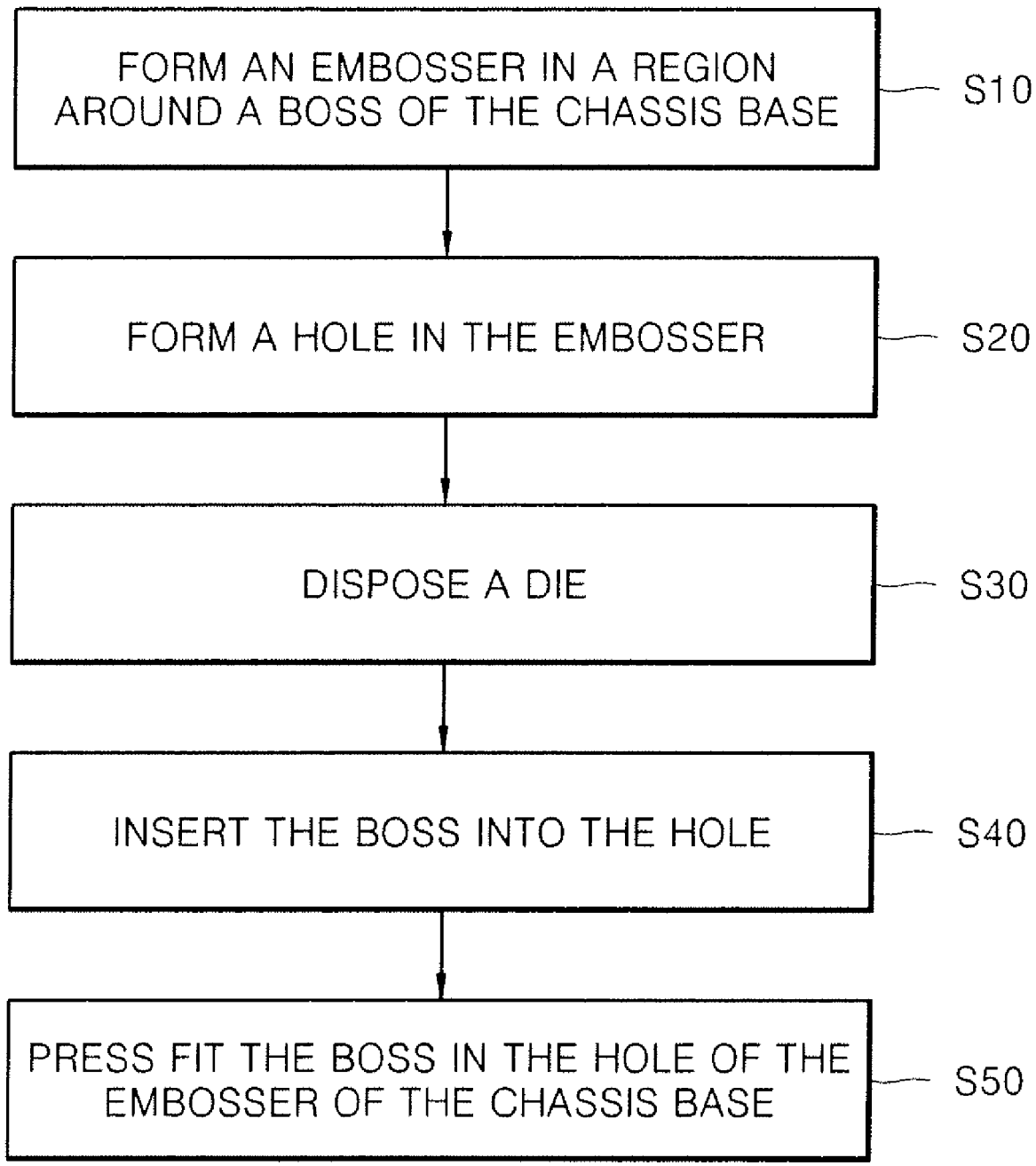
FIG. 7 is a flow chart illustrating a method of combining a boss with a chassis base according to still another embodiment of the present invention.

FIG. 6 is a cross-sectional view illustrating a press fitting of the boss 15 to the chassis base 10 according to an exemplary embodiment of the present invention, and FIG. 7 is a flow chart of a method of combining a boss with a chassis base according to another exemplary embodiment of the present invention. A method of forming the embossment 10a in the chassis base 10 and the method of combining the boss 15 with the embossment 10a will now be described with reference to FIGS. 6 and 7.

With reference to FIG. 6, the embossment 10a is formed to protrude from the surface of the chassis base 10 in the same direction in which the boss 15 protrudes (S10). The embossment 10a may be formed in the chassis base 10 using a conventional embossing processing method. More specifically, the embossment may be formed by pressing the chassis base 10 into a die 13 with a punch 14, the punch 14 and the die 13 being placed on opposite sides of the chassis base 10. As such, the embossment 10a is formed to protrude from the surface of the chassis base 10 in the same direction in which the boss 15 protrudes.

A hole may then be formed in a region of the embossment 10a where the boss 15 is will be press fitted (S20). The hole may be located in the center of the circular embossment 10a. An outer diameter of the head portion of the boss 15 is dimensioned to be larger than an inner diameter of the hole of the chassis base such that the head portion of the boss 15 can pass through the hole in the chassis base when press fitted. The die 13 is disposed on a surface of the embossment 10a on the chassis base 10 facing a direction in which the embossment 10a protrudes (S30). In one exemplary embodiment, the die 13 may be disposed such that leg portions of the die 13 contact the rear surface of the embossment 10a.

The boss 15 may then be inserted into the hole of the embossment 10a (S40). When a lower part of the boss 15 is sufficiently inserted into the hole of the embossment 10a, the lower part of the boss 15 is pressed into the embossment 10a using the punch 14 (S50). When the boss 15 is inserted into the hole of the embossment 10a, stress is generated in regions indicated by dotted circles in FIG. 6 between the chassis base 10 and the boss 15 due to the pressing force of the punch 14. However, the transmission of the stress is limited to the embossment 10a. Hence, the deformation of the chassis base 10 due to the stress is limited to a particular region of the chassis base 10, more specifically, to the region of the embossment 10a as indicated by the arrows in FIG. 6. Accordingly, the deformation of the chassis base 10 due to press fitting process is minimized, and as a result, the strength of the chassis base 10 is not reduced.

A radius R from the centerline of the boss 15 inserted into the center of the embossment 10a to an edge of the embossment 10a may be approximately 40 mm or less, and in one exemplary embodiment, may be between about 18 to 20 mm. If the radius R is greater than 40 mm, the deformation of the chassis base 10 may not be able to be limited to a particular region. As a result, the strength of the chassis base 10 is reduced, thereby reducing the reliability of the chassis base 10.

Similarly, in one exemplary embodiment, the embossment 20a has a shape that includes end arcs each having a radius of between about 18 to 20 mm from the centerline of each of the bosses 25 and the embossment 40a has an "L" shape that includes arcs of three circles each having a radius of 18 to 20 mm from the centerline of each of the bosses 45. In the exemplary embodiments of the present invention, an embossment is formed in a region around one to three bosses. However, the present invention is not limited thereto and an embossment may be formed around four or more bosses.

The method of combining the two bosses 35 with the chassis base 30 in which the first embossment 30a and the second embossment 30b are formed as depicted in FIG. 4 is similar to the method described above. However, the first and second embossments 30a, 30b may be sequentially formed in the chassis base 30. Hence, after the first embossment 30a is formed to protrude in a region around the two bosses 35 from a surface of the chassis base 30 in a direction in which the bosses protrude, the second embossment 30b, which has a arc radius less than the first embossment 30a, is recessed from the surface of the first embossment 30a in a direction opposite to the direction in which the two bosses 35 protrude. Then, the die is disposed on the surface of the chassis base 30 facing the surface from which the first embossment 30a protrudes.

Although not shown, the plasma display apparatus may further include a front cabinet and a rear cabinet. The front and rear cabinets protect the plasma display apparatus from external impact. The rear cabinet may also block the emission of electromagnetic waves from the chassis base.

Embodiments of the present invention are not limited to those described herein, but rather may be applied to any display apparatus, such as a liquid crystal display (LCD), an organic light-emitting display (OLED), or an FED including a display panel and a chassis base on which circuit boards for driving the display panel are mounted, and in which the coupling bosses with the chassis base is required.

While the present invention has been particularly shown and described with reference to exemplary embodiments thereof, it will be understood by one of ordinary skill in the art that various changes in form and details may be made thereto without departing from the spirit and scope of the present invention as defined by the following claims.

What is claimed is:

1. A display apparatus comprising:
   a display panel for displaying an image;
   a chassis base supporting the display panel;
   at least one boss protruding from the chassis base for supporting a plurality of circuit boards for driving the display panel; and
   a planar embossment surrounding the at least one boss protruding from the chassis base in a region around the at least one boss, the planar embossment including a hole adapted to receive the at least one boss, wherein a portion of the at least one boss has a diameter greater than a diameter of a wall surrounding the hole and wherein the at least one boss is press fit into the planar embossment.

2. The display apparatus of claim 1, wherein a periphery of the planar embossment includes at least one arc section.

3. The display apparatus of claim 2, wherein a radius of each at least one arc section from a centerline of a corresponding boss of the planar embossment is about 40 mm or less.

4. The display apparatus of claim 2, wherein a radius of each at least one arc section from a centerline of a corresponding boss of the planar embossment is between about 18 to 20 mm.

5. The display apparatus of claim 1, wherein the planar embossment has a generally circular shape having a center coaxial with a center of the at least one boss.

6. The display apparatus of claim 1, wherein the planar embossment has an elongated shape with curved ends in the region around the at least one boss.

7. The display apparatus of claim 6, wherein the planar embossment further comprises a first embossment section around the at least one boss and a second embossment section within the first embossment section.

8. The display apparatus of claim 7, wherein the second embossment section is recessed from a surface of the first embossment section.

9. The display apparatus of claim 1, wherein the chassis base has a thickness of 1 mm or less and wherein the chassis base further comprises steel.

10. A method of combining a chassis base and a boss comprising:
    forming a planar embossment protruding from a region of the chassis base;
    forming a hole in the planar embossment;
    disposing a die on a surface of the planar embossment in a direction opposite to which the embossment protrudes;
    providing a boss having a shaft portion and a press-fittable base portion at an end of the shaft portion;
    inserting the shaft portion into the hole; and
    press fitting the press-fittable base portion into the planar embossment using a punch such that the planar embossment surrounds the press-fittable base portion.

11. The method of claim 10, wherein a periphery of the planar embossment includes at least one arc section.

12. The method of claim 10, wherein a radius of each arc section from the centerline of the boss is about 40 mm or less.

* * * * *